United States Patent
Lee et al.

(10) Patent No.: US 7,272,007 B2
(45) Date of Patent: Sep. 18, 2007

(54) LOCKING DEVICE FOR HEAT SINK

(75) Inventors: Hsieh-Kun Lee, Tu-Cheng (TW);
Cheng-Tien Lai, Tu-Cheng (TW);
Zhi-Yong Zhou, Shenzhen (CN);
Bo-Tao Wang, Shenzhen (CN)

(73) Assignees: Fu zhun Precision Industry (Shenzhen) Co., Ltd., Bao'and District, Shenzhen, Quangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 298 days.

(21) Appl. No.: 11/012,423

(22) Filed: Dec. 14, 2004

(65) Prior Publication Data

US 2006/0126301 A1    Jun. 15, 2006

(51) Int. Cl.
*H05K 7/20* (2006.01)

(52) U.S. Cl. ............... 361/704; 165/80.3; 165/185; 257/719; 361/710; 361/719

(58) Field of Classification Search ........ 257/718–719; 361/704, 719

See application file for complete search history.

(56) References Cited

U.S. PATENT DOCUMENTS

| | | | | |
|---|---|---|---|---|
| 6,064,574 A | * | 5/2000 | Yu et al. ................. | 361/704 |
| 6,160,709 A | * | 12/2000 | Li ............................ | 361/704 |
| 6,477,050 B1 | * | 11/2002 | Herring et al. ............ | 361/704 |
| 6,648,664 B1 | * | 11/2003 | McHugh et al. ........... | 439/331 |
| 6,976,525 B2 | * | 12/2005 | Lin ........................... | 165/80.3 |

FOREIGN PATENT DOCUMENTS

| | | |
|---|---|---|
| TW | 462511 | 11/2001 |
| TW | 586652 | 5/2004 |

* cited by examiner

*Primary Examiner*—Gregory D Thompson
(74) *Attorney, Agent, or Firm*—Morris Manning & Manning LLP; Tim Tingkang Xia, Esq.

(57) ABSTRACT

A locking device (10) for securing a heat sink to an electronic device includes a rectangular main frame (20), four first fasteners (30) respectively pivotably attached to four corners of the main frame and two second fasteners (40) pivotably attached to the main frame at opposite sides thereof. Each of the first and second fasteners respectively is capable of rotating relative to the main frame from a non-stretched position to a stretched position for attachment of the heat sink to the electronic device.

20 Claims, 8 Drawing Sheets

1

LOCKING DEVICE FOR HEAT SINK

TECHNICAL FIELD

The present invention relates generally to a locking device, and more particularly to a locking device for securing a heat sink to an electronic device.

BACKGROUND

It is widely acknowledged that heat is produced during operations of electronic devices such as central processing units (CPUs). The heat produced must be quickly removed to ensure the CPUs working normally. Typically, a heat sink is provided to a CPU for removing heat from the CPU. In order to keep the heat sink into close contact with the CPU, a locking device is generally required.

FIG. 8 shows a conventional locking device for securing a heat sink 40 to a CPU 100 mounted on a printed circuit board (PCB) 10. The locking device comprises a rectangular retention frame 20, four fastening pins 30 and a wire clip 50. Four retaining holes 12 are defined in the PCB 10 surrounding the CPU 100. Four positioning holes 28 are defined at four corners of the retention frame 20 in alignment with the retaining holes 12 of the PCB 10. A pair of ears 29 is diagonally formed from the retention frame 20 at opposite sides thereof. The clip 50 comprises an elongated pressing beam 52 and a pair of locking feet 54 extending from opposite ends of the pressing beam 52. In assembly, the fastening pins 30 respectively pass through the positioning holes 28 of the retention frame 20 and engage with the PCB 10 in the retaining holes 12 to thereby hold the retention frame 20 on the PCB 10. The clip 50 is positioned on the heat sink 40 with the locking feet 54 engaging with the ears 29 and the pressing beam 52 abutting against a chassis 42 of the heat sink 40 to thereby firmly secure the heat sink 40 to the CPU 100. However, the locking device is only applicable for attachment of the heat sink 40 to a PCB with retaining holes in alignment with the positioning holes 28 of the retention frame 20. When a PCB having a configuration of retaining holes different from the above-mentioned is used, the locking device becomes disqualified.

SUMMARY OF THE INVENTION

Accordingly, an object of the present invention is to provide a locking device which is able to secure a heat sink to PCBs with different configurations of retaining holes.

In order to achieve the object set out above, a locking device for a heat sink in accordance with a preferred embodiment of the present invention comprises a main frame, and at least one first fastener and at least one second fastener pivotably attached to the main frame respectively. Each of the first and second fasteners is capable of rotating relative to the main frame from a non-stretched position to a stretched position for securing of the heat sink to the electronic device.

Other objects, advantages and novel features of the present invention will become more apparent from the following detailed description when taken in conjunction with the accompanying drawings, in which:

DETAILED DESCRIPTION OF PREFERRED EMBODIMENTS

Figure 1:
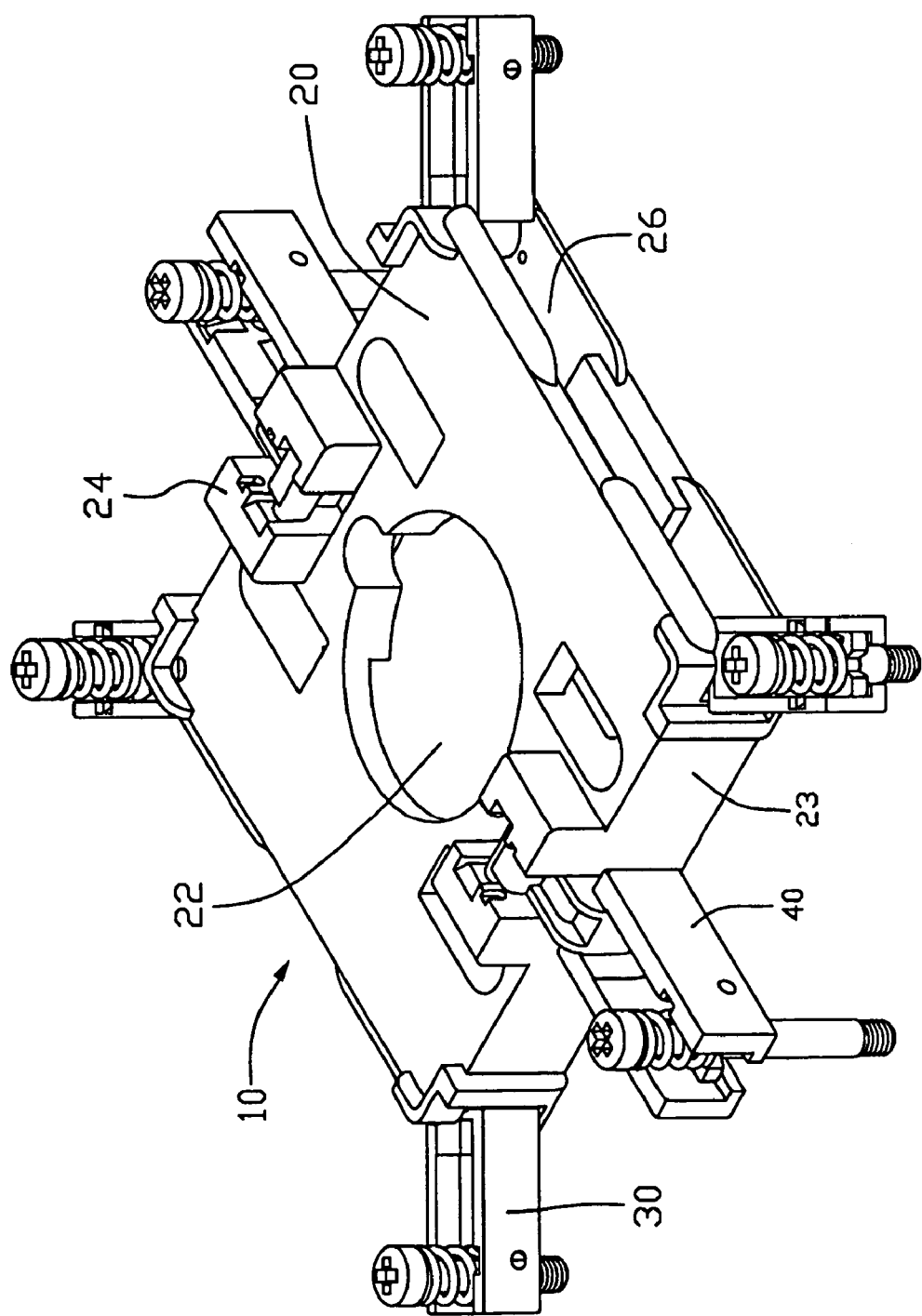
FIG. 1 is an isometric view of a locking device according to a preferred embodiment of the present invention with the first and second fasteners respectively located at their stretched positions.

Reference will now be made to the drawing figures to describe the present invention in detail.

FIG. 1 illustrates a locking device 10 for a heat sink assembly which is used to dissipate heat from a heat generating component like a central processing unit (CPU) according to a preferred embodiment of the present invention. The locking device 10 comprises a rectangular main frame 20 with an opening 22 and a plurality of fasteners pivotably attached to the main frame 20. The main frame 20 has four side edges 23 to corporatively define a periphery of the main frame 20. Two pairs of connecting blocks 24 are upwardly formed from opposite side edges of the main frame 20. The fasteners include four first fasteners 30 pivotably attached to respective four corners of the main frame 20, and two second fasteners 40 pivotably attached to the respective pairs of connecting blocks 24. A slot 26 is defined in the main frame 20 adjacent each first fastener 30.

Figure 2:
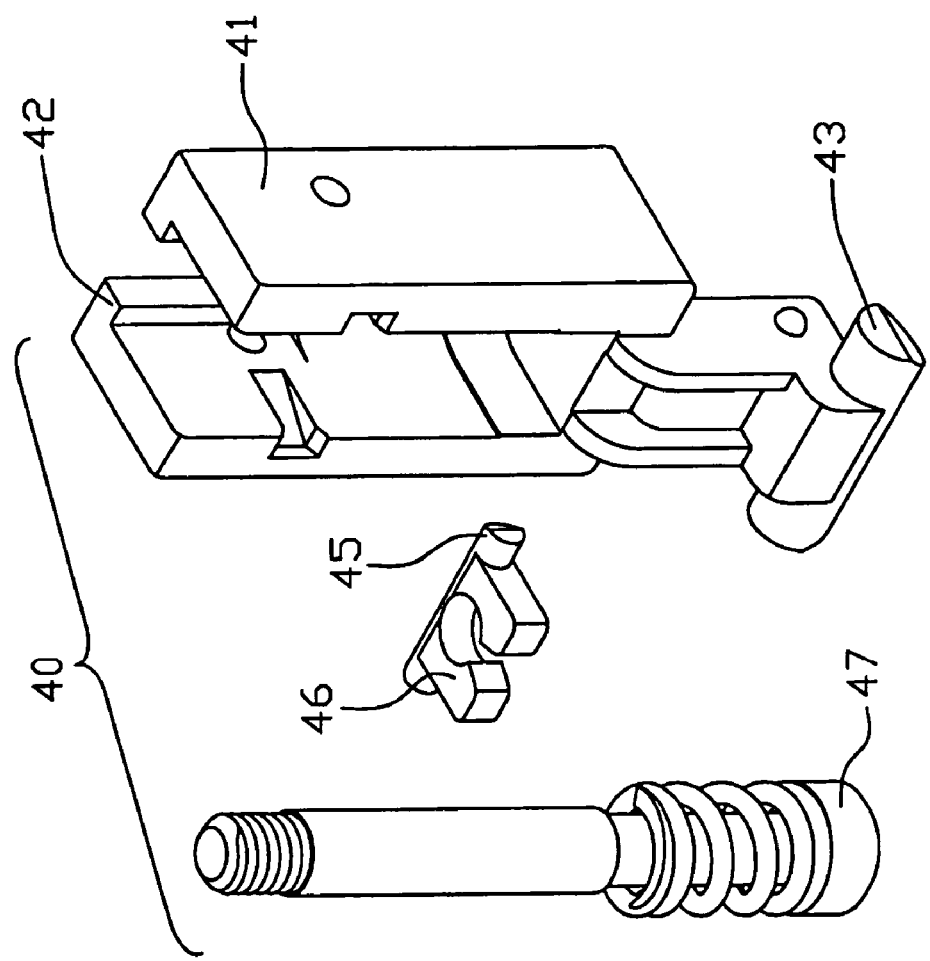
FIG. 2 is an exploded, isometric view of one second fastener of the locking device of FIG. 1.

In the preferred embodiment of the present invention, the first and second fasteners 30, 40 are substantially identical in structures. FIG. 2 shows more details of a second fastener 40. The second fastener 40 includes a pair of spaced sidewalls 41, a first pivot member 45 and a screw 47 for engaging in a corresponding retaining hole of a PCB (not shown). A second pivot member 43 extends outward from one side of the sidewalls 41 for being retainably attached to the corresponding pair of connecting blocks 24 of the main frame 20. Each of the sidewalls 41 has a stopping wall 42 extending from a bottom edge thereof. A pair of abutting walls 46 is formed from the first pivot member 45. In assembly, the screw 47 is combined to the first pivot member 45 and further is pivotably attached to the sidewalls 41 such that the screw 47 is capable of rotating about the first pivot member 45 with respect to the sidewalls 41 from a first position at which the screw 47 is parallel to the sidewalls 41 (See FIG. 3) to a second position at which the screw 47 is perpendicular to the sidewalls 41 (See FIG. 4). At the second position, the abutting walls 46 of the first pivot member 45 are in abutment with the stopping walls 42 of the sidewalls 41 to thereby maintain the screw 47 in position.

Figure 3:
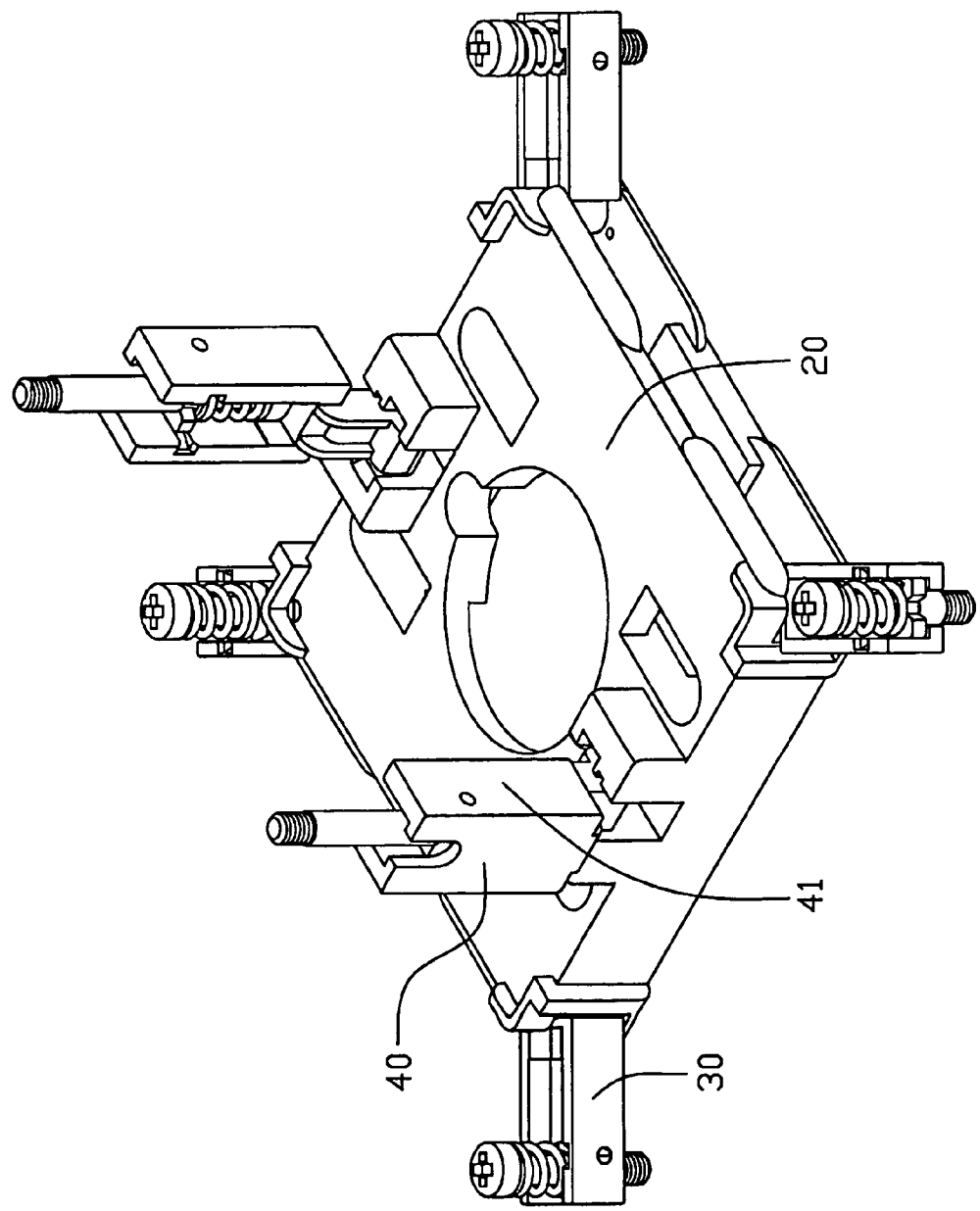
FIG. 3 is an isometric view of the locking device of FIG. 1 with the second fasteners located at their non-stretched positions.
Figure 4:
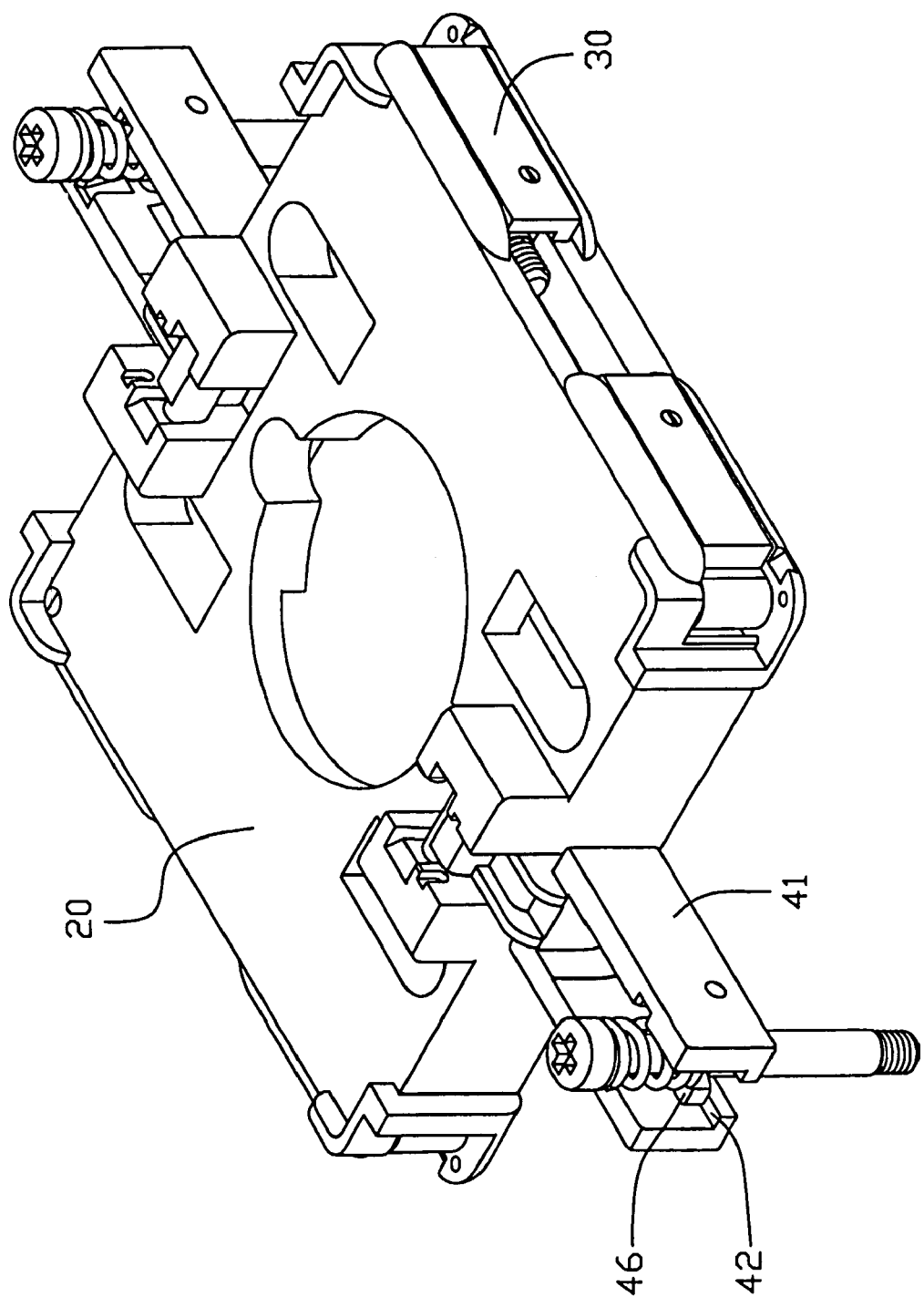
FIG. 4 is an isometric view of the locking device of FIG. 1 with the first fasteners located at their non-stretched positions.

The first fasteners 30 and the second fasteners 40 respectively are capable of rotating relative to the main frame 20 from a stretched position to a non-stretched position. The first fasteners 30 are capable of rotating along a plane parallel to the main frame 20 while the second fasteners 40 are capable of rotating along a plane perpendicular to the main frame 20. In FIG. 1, all of the fasteners 30, 40 are located at their stretched positions at which the fasteners 30, 40 extend out of the main frame 20. FIG. 3 shows the second fasteners 40 are located at their non-stretched positions at which the second fasteners 40 stand above the main frame 20. FIG. 4 shows the first fasteners 30 are located at their non-stretched positions at which the first fasteners 30 are received in the slots 26 of the main frame 20. Therefore, the locking devices 10 shown in FIG. 3 and FIG. 4 can be applied to attach a heat sink to different kinds of PCBs on which retaining holes with different layouts may define.

Figure 5:
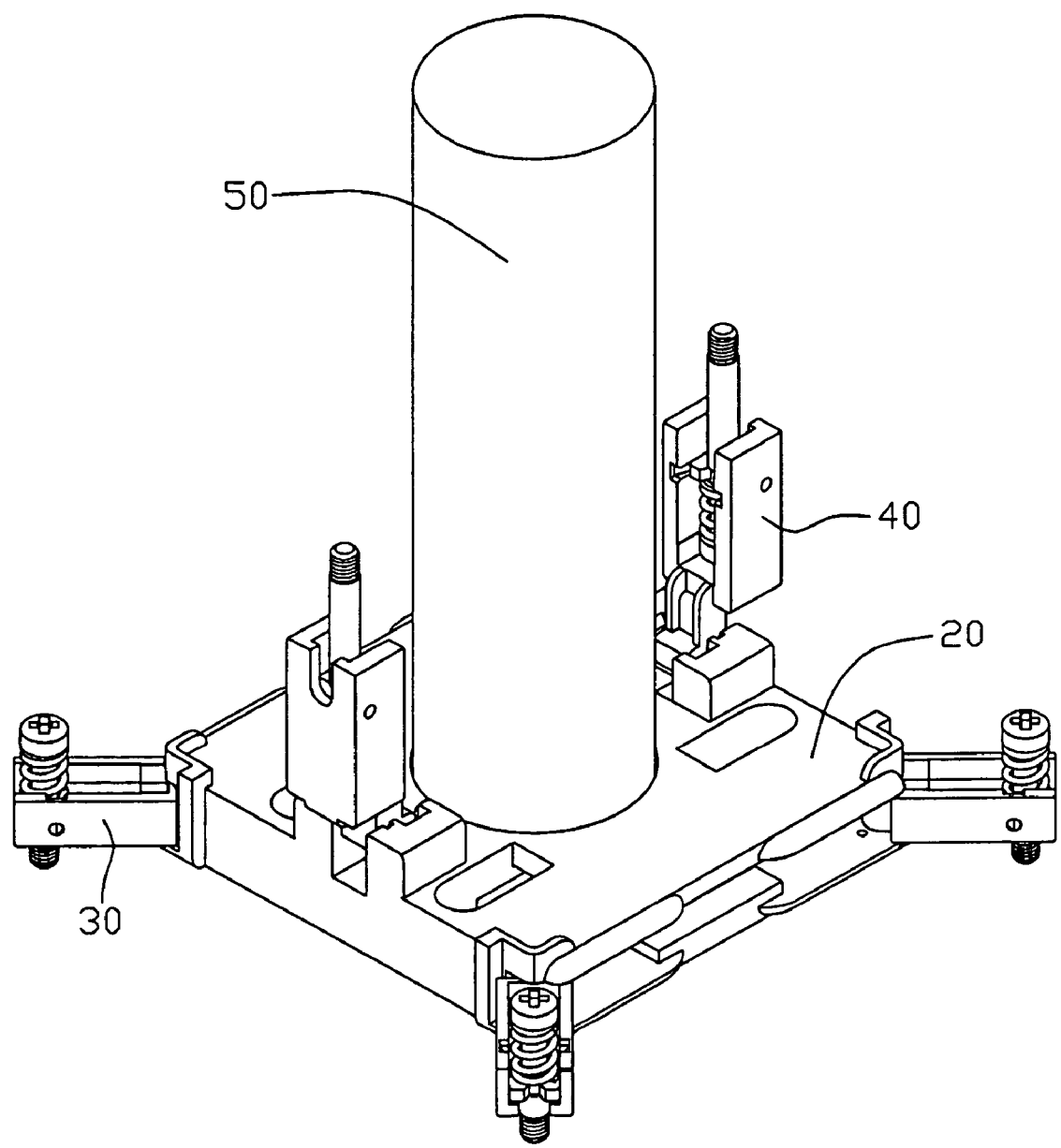
FIG. 5 is an isometric view of the locking device of FIG. 3, with a heat pipe mounted thereon.
Figure 6:
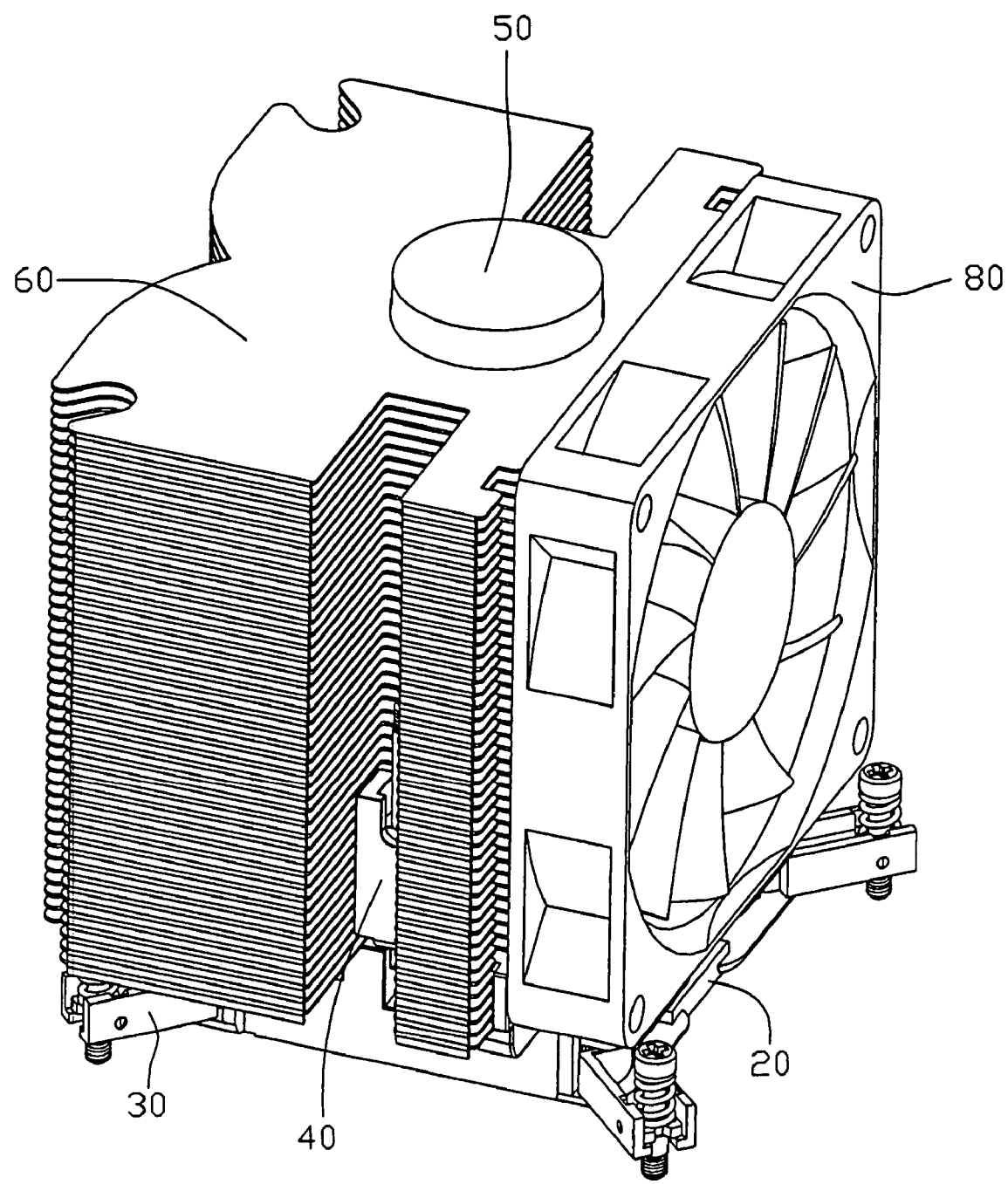
FIG. 6 is an isometric view of the locking device of FIG. 5, with a plurality of cooling fins stacked along the heat pipe.
Figure 7:
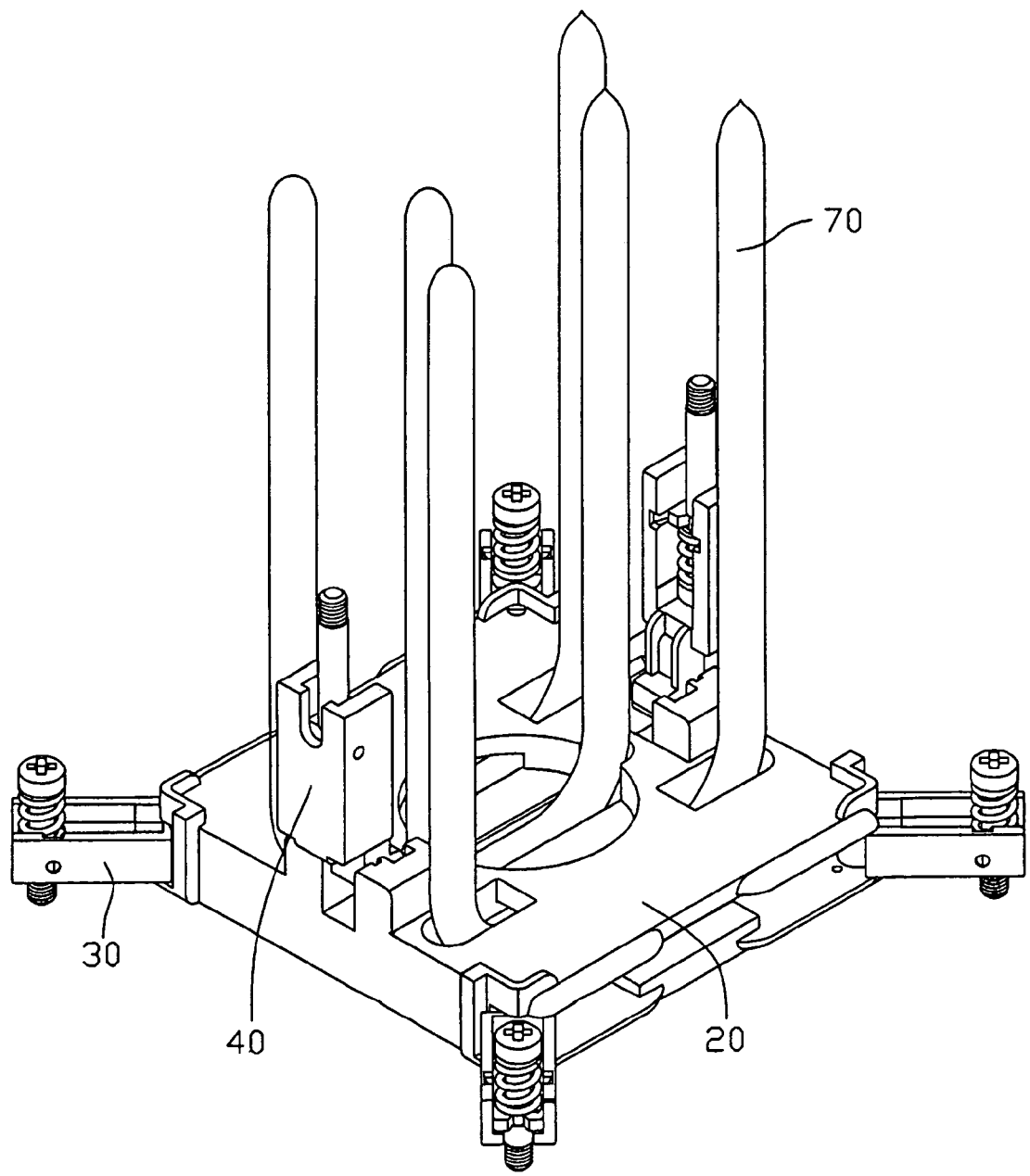
FIG. 7 is an isometric view of the locking device of FIG. 3, with a plurality of heat pipes mounted thereon.
Figure 8:
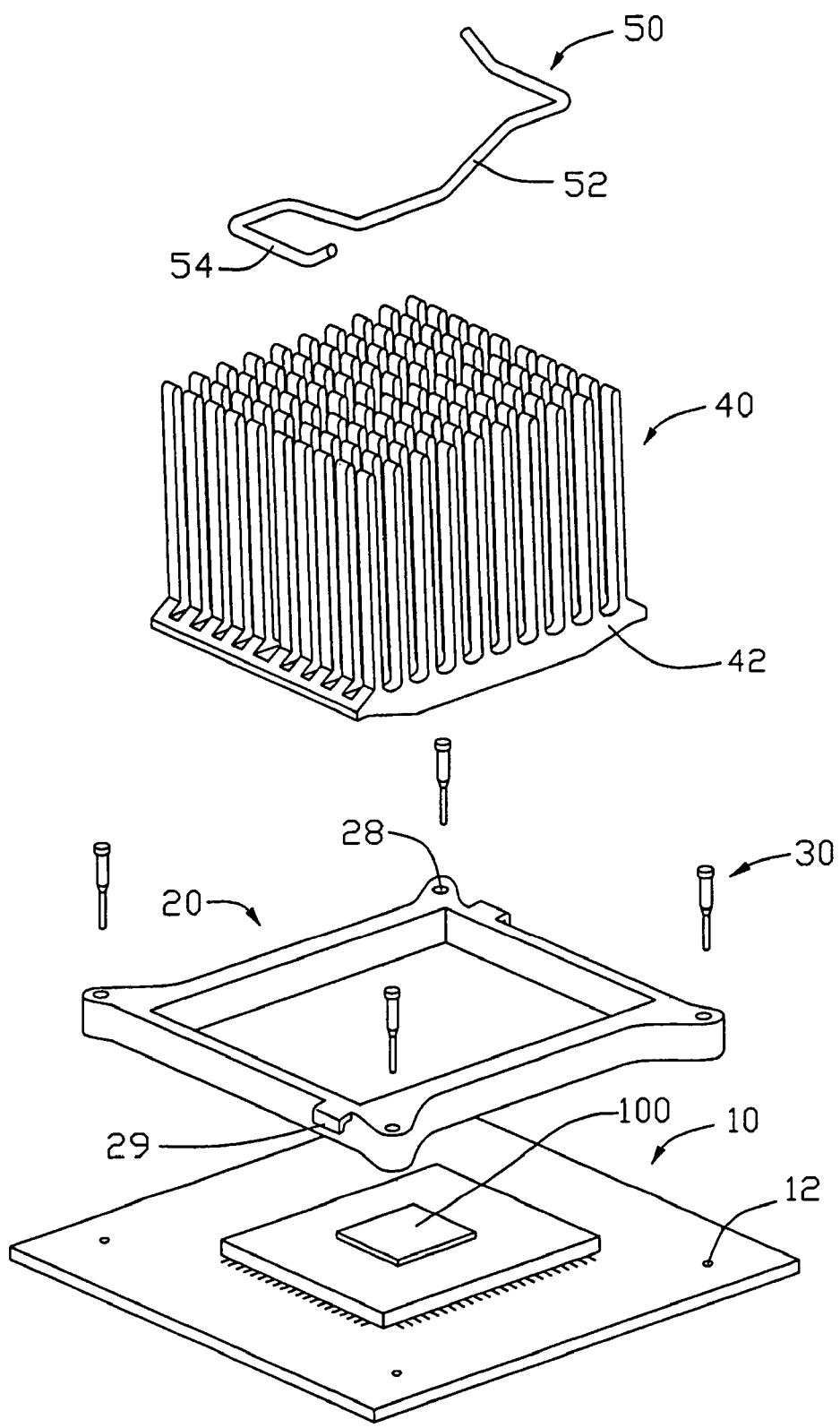
FIG. 8 is exploded, isometric view of a conventional locking device for securing a heat sink to a CPU mounted on a PCB.

FIGS. 5-6 illustrate the locking device 10 shown in FIG. 3 being applied to attach a heat sink to a PCB (not shown). The heat sink comprises a heat pipe 50, a plurality of cooling fins 60 stacked along the heat pipe 50 and a cooling fan 80 for providing forced airflow toward the cooling fins 60. A lower portion of the heat pipe 50 is retainably received in the opening 22 of the main frame 20. The second fasteners 40 of the locking device 10 are located at their non-stretched positions and received in respective spaces (not labeled) defined at opposite sides of the cooling fins 60 such that the second fasteners 40 do not interfere with other electronic devices adjacent the main frame 20. Apparently, changes may be made to the heat pipe 50, especially in size or shape, for example, a plurality of U-shaped heat pipes 70 as shown in FIG. 7 is applied.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A locking device for a heat sink comprising:
a main frame for supporting the heat sink thereon;
at least one first fastener pivotably attached to the main frame; and
at least one second fastener pivotably attached to the main frame;
wherein each of the first and second fasteners is capable of rotating relative to the main frame from a non-stretched position to a stretched position for securing of the main frame together with the heat sink to a printed circuit board by an engagement of the each of the first and second fasteners with the printed circuit board.

2. The locking device of claim 1, wherein the main frame is substantially rectangular in shape with an opening therein.

3. The locking device of claim 1, wherein a slot is defined in the main frame for receiving the first fastener at its non-stretched position.

4. The locking device of claim 2, wherein the locking device includes a pair of first fasteners attached to two diagonal corners of the main frame.

5. The locking device of claim 4, wherein the locking device includes a pair of second fasteners attached to the main frame at opposite sides thereof.

6. The locking device of claim 5, wherein each second fastener is attached to a pair of connecting blocks formed from the main frame.

7. The locking device of claim 1, wherein each of the first and second fasteners includes a pair of sidewalls, a first pivot member attached to the sidewalls, a second pivot member extending from one side of the sidewalls and a screw combined to the first pivot member.

8. The locking device of claim 7, wherein the screw is capable of rotating about the first pivot member from a first position at which the screw is located perpendicular to the sidewalls to a second position at which the screw is located parallel to the sidewalls.

9. The locking device of claim 8, wherein the first pivot member has an abutting wall in abutment with a stopping wall which extends from a bottom portion of each sidewall when the screw is located at the second position.

10. A heat sink assembly for an electronic device comprising:
a heat sink; and
a locking device for securing the heat sink to said electronic device, the locking device comprising:
a main frame in abutment with the heat sink;
at least one first fastener pivotably attached to the main frame; and
at least one second fastener pivotably attached to the main frame;
wherein each of the first and second fasteners is capable of moving relative to the main frame from a stretched position to a non-stretched position, and when one of said first and second fasteners is located at the non-stretched position, the other is located at the stretched position so that the each of the first and second fasteners is selectable to secure the main frame to said electronic device according to a layout of said electronic device.

11. The heat sink assembly of claim 10, wherein the main frame is substantially rectangular in shape with an opening defined therein.

12. The heat sink assembly of claim 11, wherein the heat sink includes a heat pipe and a plurality of cooling fins stacked along the heat pipe, a lower portion of the heat pipe being retainably received in said opening.

13. The heat sink assembly of claim 10, wherein the first fastener is capable of moving from the stretched position to the non-stretched position in a plane parallel to the main frame.

14. The heat sink assembly of claim 13, wherein the second fastener is capable of moving from the stretched position to the non-stretched position in a plane perpendicular to the main frame.

15. A locking device for a heat sink comprising:
a rectangular main frame having four side edges cooperatively defining a periphery thereof;
a pair of first fasteners pivotably attached to a diagonal of the main frame; and
a pair of second fasteners pivotably attached to the main frame at opposite side edges thereof;
wherein each of the first and second fasteners is capable of moving relative to the main frame from a stretched position at which the each of the first and second fasteners extends out of the periphery of the main frame to a non-stretched position at which the each of the first and second fasteners stands within the periphery of the main frame.

16. A heat sink assembly comprising:
a heat sink used to thermally contact with a heat generating component and dissipate heat from said heat generating component to ambient air around said heat sink; and
a locking device attached to said heat sink and approachable to said heat generating component together with said heat sink, said locking device having main frame defining at least one slot therein, and a fastener attached to said main frame corresponding to said at least one slot, said fastener movable between a first position where said fastener is fully received in said at least one slot and a second position where said fastener extends out of said at least one slot to be fixable to a printed circuit board on which said heat generating component is mounted so as to have said heat sink in a securely thermal contact with said heat generating component.

17. The heat sink assembly of claim 16, wherein said locking device comprises another fastener attached thereto, said another fastener in a first position thereof is fully receivable in a space defined in said heat sink and, in a second position thereof, extends out of said space to be fixable to the printed circuit board on which said heat generating component is mounted so as to have said heat sink in a securely thermal contact with said heat generating component.

18. The locking device of claim 1, wherein each of the first and second fasteners includes a screw, the screw being capable of moving relative to the main frame from a first position to a second position prior to securing of the main frame together with the heat sink to the printed circuit board.

19. The locking device of claim 15, wherein the each of the first and second fasteners includes a screw capable of moving relative to the main frame when the each of the first and second fasteners is located at the stretched position.

20. The locking device of claim 19, wherein when the each of the first and second fasteners is located at the stretched position, the screw is capable of moving relative to the main frame from a first position at which the screw is shrouded in the each of the first and second fasteners to a second position at which the screw is ready to secure the main frame on a heat generating component to be cooled by the heat sink.

* * * * *